(12) United States Patent
Pance et al.

(10) Patent No.: US 8,749,523 B2
(45) Date of Patent: Jun. 10, 2014

(54) METHODS AND APPARATUS FOR CAPACITIVE SENSING

(75) Inventors: Aleksandar Pance, Saratoga, CA (US); Omar S. Leung, Palo Alto, CA (US); David Thomas Amm, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 833 days.

(21) Appl. No.: 12/861,640

(22) Filed: Aug. 23, 2010

(65) Prior Publication Data

US 2011/0043227 A1 Feb. 24, 2011

Related U.S. Application Data

(63) Continuation-in-part of application No. 12/257,956, filed on Oct. 24, 2008, now Pat. No. 8,436,816.

(60) Provisional application No. 61/235,905, filed on Aug. 21, 2009.

(51) Int. Cl.
*G06F 3/042* (2006.01)
*G01R 27/26* (2006.01)

(52) U.S. Cl.
USPC ............................ 345/175; 345/176; 324/681

(58) Field of Classification Search
CPC ........... G06F 3/414; G06F 3/416; G06F 3/44; G06F 3/03547; H03K 17/955; H03K 17/962; H03K 2217/96077; H03K 2217/960755; H03K 2217/9607; H03K 2217/960705; H03K 2217/960785
USPC .................. 345/156–184; 324/669, 681, 686; 361/679.4, 752, 679.3, 681; 340/5, 54; 273/237

See application file for complete search history.

(56) References Cited

U.S. PATENT DOCUMENTS

| | | | |
|---|---|---|---|
| 4,016,490 A * | 4/1977 | Weckenmann et al. | 324/671 |
| 4,614,937 A | 9/1986 | Poujois | |
| 5,410,497 A | 4/1995 | Viletto | |
| 7,221,092 B2 | 5/2007 | Anzai et al. | |
| 7,356,361 B1 | 4/2008 | Hawkins et al. | |
| 7,502,221 B2 | 3/2009 | Fuller et al. | |

(Continued)

FOREIGN PATENT DOCUMENTS

| | | |
|---|---|---|
| EP | 0086135 A1 | 8/1983 |
| EP | 1593988 A1 | 11/2005 |

(Continued)

OTHER PUBLICATIONS

"Analog devices—Captouch Programmable Controller for Single-Electrode Capacitance Sensors", Data Sheet—AD7147, (Jul. 2009), 72 pgs.

(Continued)

*Primary Examiner* — Prabodh M Dharia
(74) *Attorney, Agent, or Firm* — Michael H. Lyons

(57) ABSTRACT

The present disclosure addresses methods and apparatus facilitating capacitive sensing using a conductive surface, and facilitating the sensing of proximity to the conductive surface. The sensed proximity will often be that of a user, but can be another source of a reference voltage potential. In some examples, the described systems are capable of sensing capacitance (including parasitic capacitance) in a circuit that includes the outer conductive surface, and where that outer conductive surface is at a floating electrical potential. In some systems, the systems can be switched between two operating modes, a first mode in which the system will sense proximity to the conductive surface, and a second mode in which the system will use a capacitance measurement to sense contact with the conductive surface.

28 Claims, 6 Drawing Sheets

(56) References Cited

U.S. PATENT DOCUMENTS

| | | | |
|---|---|---|---|
| 7,538,760 B2* | 5/2009 | Hotelling et al. | 345/173 |
| 7,595,788 B2* | 9/2009 | Son | 345/168 |
| 7,663,612 B2* | 2/2010 | Bladt | 345/176 |
| 8,115,753 B2* | 2/2012 | Newton | 345/175 |
| 8,517,383 B2* | 8/2013 | Wallace et al. | 273/237 |
| 2002/0015024 A1* | 2/2002 | Westerman et al. | 345/173 |
| 2006/0066579 A1* | 3/2006 | Bladt | 345/173 |
| 2006/0152497 A1 | 7/2006 | Rekimoto | |
| 2006/0248363 A1 | 11/2006 | Chen et al. | |
| 2006/0274493 A1* | 12/2006 | Richardson et al. | 361/683 |
| 2006/0278444 A1* | 12/2006 | Binstead | 178/18.06 |
| 2007/0126711 A1* | 6/2007 | Oshita | 345/173 |
| 2007/0229464 A1* | 10/2007 | Hotelling et al. | 345/173 |
| 2007/0239921 A1 | 10/2007 | Toorians et al. | |
| 2007/0242037 A1* | 10/2007 | Son | 345/156 |
| 2008/0246735 A1* | 10/2008 | Reynolds et al. | 345/173 |
| 2008/0259053 A1* | 10/2008 | Newton | 345/175 |
| 2008/0297487 A1 | 12/2008 | Hotelling et al. | |
| 2009/0315258 A1* | 12/2009 | Wallace et al. | 273/238 |
| 2010/0103116 A1 | 4/2010 | Leung et al. | |
| 2010/0253651 A1* | 10/2010 | Day | 345/175 |
| 2011/0012793 A1 | 1/2011 | Amm et al. | |
| 2011/0012794 A1 | 1/2011 | Schlub et al. | |
| 2011/0050509 A1 | 3/2011 | Vazquez et al. | |
| 2012/0092298 A1* | 4/2012 | Koottungal | 345/174 |
| 2012/0214412 A1 | 8/2012 | Schlub et al. | |
| 2012/0223865 A1 | 9/2012 | Li et al. | |
| 2012/0223866 A1 | 9/2012 | Vazquez et al. | |

FOREIGN PATENT DOCUMENTS

| | | |
|---|---|---|
| JP | 05-128828 A | 5/1993 |
| JP | 2003330618 | 11/2003 |
| JP | 2007-170995 A | 7/2007 |
| JP | 2008046070 | 2/2008 |
| WO | WO-2006/060232 A2 | 6/2006 |
| WO | 2007124333 | 1/2007 |
| WO | WO-2011/022067 A1 | 2/2011 |

OTHER PUBLICATIONS

"International Application Serial No. PCT/US2010/002291, International Preliminary Report on Patentability mailed Mar. 1, 2012", 13 pgs.

"International Application Serial No. PCT/US2010/002291, International Search Report mailed Jan. 26, 2011", 5 pgs.

"International Application Serial No. PCT/US2010/002291, Written Opinion mailed Jan. 26, 2011", 12 pgs.

* cited by examiner

METHODS AND APPARATUS FOR CAPACITIVE SENSING

This application claims the benefit of U.S. provisional application Ser. No. 61/235,905, filed Aug. 21, 2009; and is a continuation-in-part of U.S. application Ser. No. 12/257,956, filed Oct. 24, 2008 now U.S. Pat. No. 8,436,816. Each of these applications is hereby incorporated by reference.

BACKGROUND OF THE INVENTION

The present invention relates generally to methods and apparatus for capacitive sensing; and more particularly includes methods and apparatus which use a conductive surface, such as metal, in the sensing mechanism, and which are used to detect proximity and potentially touch of a user in order to provide user input signals to an electronic device.

Many user interfaces are known which utilize capacitive sensing to identify user inputs to an electronic device, such as a computer, media playing device, phone etc. Some of these interfaces are implemented as touch screen systems where one or more capacitance sensing mechanisms, such as electrodes are placed under a transparent outer surface, typically formed of glass or plastic, and above a display element.

A limitation of many conventional capacitive sensing devices is that the outer surface needs to be formed of a non-conductive material, such as the glass outer surface of touch screen devices. Thus, even input devices that do not require transparency for operation, such as track pads that operate based upon capacitive sensing, will include a contact surface formed of glass or of another non-conductive material.

Thus, conventional capacitive sensing input devices for electronic devices offer some limitations on how they may be utilized. For example, applications may be envisioned where it would be desirable to allow for proximity or touch-responsive inputs even where the surface is formed of a conductor, such as a metal. Applications may be envisioned wherein some portion of the outer case of an electronic device, such as a media player or laptop computer, might be sensitive to proximity and/or touch of a user in order to initiate various functions of the device, potentially before there has been any direct contact with the device.

Accordingly, the methods and apparatus disclosed herein identify systems for sensing the proximity, and in some embodiments, also touch, of a user even where the surface proximate the user is formed of metal or another conductor.

BRIEF DESCRIPTION OF THE DRAWINGS

FIGS. 7A-B depict a portion of an electronic device; wherein FIG. 7A depicts an invisible button region on a surface of the device; and FIG. 7B depicts a magnified view of a section of the invisible button region.

DETAILED DESCRIPTION OF PREFERRED EMBODIMENTS

The following detailed description refers to the accompanying drawings that depict various details of examples selected to show how the present invention may be practiced. The discussion addresses various examples of the inventive subject matter at least partially in reference to these drawings, and describes the depicted embodiments in sufficient detail to enable those skilled in the art to practice the invention. Many other embodiments may be utilized for practicing the inventive subject matter than the illustrative examples discussed herein, and many structural and operational changes in addition to the alternatives specifically discussed herein may be made without departing from the scope of the inventive subject matter.

In this description, references to an "embodiment," or to an "example" mean that the feature being referred to is, or may be, included in at least one embodiment or example of the invention. Separate references to "an embodiment" or "one embodiment" or to "one example" or "an example" in this description are not intended to necessarily refer to the same embodiment or example; however, neither are such embodiments mutually exclusive, unless so stated or as will be readily apparent to those of ordinary skill in the art having the benefit of this disclosure. Thus, the present invention can include a variety of combinations and/or integrations of the embodiments and examples described herein, as well as further embodiments and examples as defined within the scope of all claims based on this disclosure, as well as all legal equivalents of such claims.

For the purposes of this specification, "electronic device" as used herein, includes a system using one or more processors, microcontrollers and/or digital signal processors or other devices having the capability of running a "program," (all such devices being referred to herein as a "processor"). A "program" is any set of executable machine code instructions, and as used herein, includes user-level applications as well as system-directed applications or daemons. Examples of electronic devices include communication and electronic devices such as cell phones, music and multi-media players, Personal Digital Assistants (PDA), and "set top boxes"; as well as computers, or "computing devices" of all forms (desktops, laptops, servers, palmtops, workstations, etc.).

Figure 1:
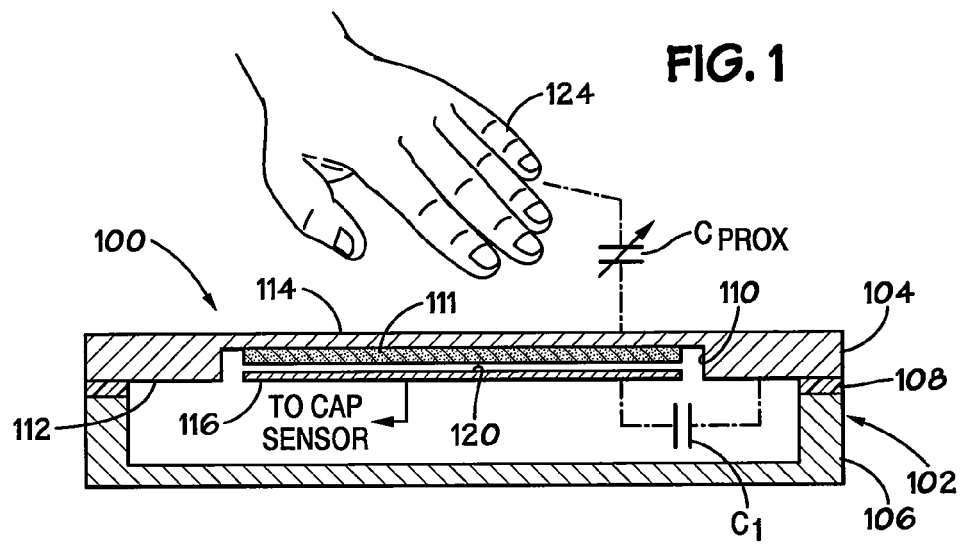
FIG. 1 depicts a simplified representation of the sensing components of a proximity sensing system in accordance with the present invention.
Figure 2:
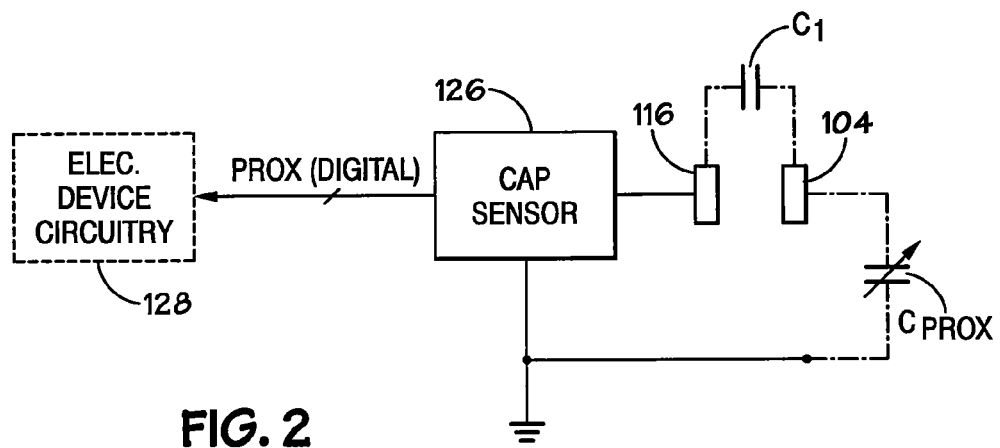
FIG. 2 depicts a schematic representation of a proximity sensing system utilizing the sensing components of FIG. 1.

Referring now to FIGS. 1 and 2, FIG. 1 depicts a simplified representation of the sensing components 100 of an example inventive proximity sensing system in accordance with the present invention; while FIG. 2 depicts a schematic representation of a new proximity sensing system 200 using those sensing components. Elements of FIG. 1 have been numbered identically in FIG. 2. As will be described below, proximity sensing system 200 detects proximity of an external potential source, such as a human user, to an outer conductive surface, by sensing capacitance (including parasitic capacitance) in a circuit that includes the outer conductive surface, and where that outer conductive surface is at a floating electrical potential.

Proximity sensing system 100 includes an enclosure, indicated generally at 102. Enclosure 102 may be of any of a wide variety of configurations, but for purposes of the present description will be described generally in the context of an outer housing as might be used for a laptop computer. Enclosure 102 includes a metal lid 104 and a metal lower section 106. The present invention is in no way limited to use in laptops and similar devices, but may be used with virtually any electronic device where it is desired to sense proximity of a source of electrical potential, such as a user, to a conductive outer surface. Accordingly, there is no requirement that a bottom portion of any enclosure be formed of a metal or other conductive material. In the depicted example, where sensing components include a metal enclosure 102, it will often be desirable to insulate metal lid 104 from the metal lower section 106. In enclosure 102, an insulated gasket 108 is disposed between lid 104 and lower section 106. If lid 104 is not insulated from lower section 106, then the entire enclosure should be maintained at a floating potential. However, such configurations are believed to offer less noise immunity than systems such as that depicted, where the lower section 106 may be grounded, and thus offer shielding from outside sources of potentially interfering electrical noise. Thus, the described configuration will often offer improved measurements for determining proximity of a user. In addition to insulated gasket 108, it will be apparent to those skilled in the art that other potential points of electrical conduction between the two components will need to be avoided. For example, this could include providing electrical insulation between the hinge components by which the lid and lower section are attached; and assuring a non-electrically conductive path through any latch assembly used to secure the two components in a closed orientation to one another.

In a sensing region 114 of lid 104 in which sensitivity to user proximity is desired, the metal lid will be thinned, such as by forming a recess 110 in inner surface 112 of lid 104. The specific dimensions may vary depending upon the specific application. However, as one example, a metal thickness of approximately 0.3 to 1 mm will be appropriate for many applications, with a more preferred range being between approximately 0.4 and 0.6 mm.

An electrode 116 will be disposed within recess 110 proximate sensing region 114, and in spaced relation to that region, to cooperatively form a parallel plate capacitor (C1). Electrode 116 may be of any of a variety of configurations, including a solid wire or flat conductor, a plated conductor on a printed circuit board (PCB), a conductive film, such as a metal or indium tin oxide film, etc. Electrode 116 may be maintained in that spaced relation to sensing region 114 by either or both of an insulative layer, as depicted at 118, and an air gap, as depicted at 120. As one example, where electrode 116 is implemented in the form of a conductive film, the conductive film, along with the electrical insulator may be adhesively coupled within recess 110 to sensing region 114 of lid 104. Electrode 116 may be implemented in any manner that in combination with lid 104 forms a capacitor that is appropriately sized in view of the electrical design of the remaining components of the system. For many applications, a minimal capacitance C1 would be preferable, as that allows the greatest influence on measurements by the proximity-induced capacitance, as will be described in more detail below.

For purposes of this illustrative embodiment, electrode 116 is coupled to the input of a capacitive sensor 126. This input provides a high impedance (at DC) connection to ground. The value of the "high" impedance will vary depending on the sensor used, but will typically be in the megohm range or higher. Lid 104, however, is not tied to any potential, but is electrically floating. As noted previously, it is not required that lower section 106 be electrically insulated from lid 104, and in such applications where it is not, then lower section 106 will also be at a floating potential. Capacitance sensor 126 will be coupled between reference electrode 116 and ground. Capacitance sensor 126 may be selected from commercially available alternatives. As one example, the Model ADI 7147 multi-channel sensor from Analog Devices of Norwood, Mass. is suitable for some applications. That sensor converts capacitance to voltage, and then generates a digital output representative of the measured capacitance. Where signals are provided to multiple input channels, the ADI 7147 can output measurements of each channel to facilitate various possible types of measurements or control functions.

As depicted in FIG. 1, an external potential source, which will most commonly be a user's body, such as a hand, will cooperatively form a capacitance (Cprox) with the electrically floating lid 104. For purposes of illustration, the user may be considered as a external potential source that is, at most times, at ground potential. While not wishing to be bound by theory, in at least some implementations, electrically floating lid 104 may be considered, in effect, as an electrostatic antenna, sensitive to the potential of the user's hand. Because lid 104 is electrically floating, the total capacitance formed between the external source potential (such as the hand) and electrode 116 (C1+Cprox) will vary in response to proximity of the external source.

In operation, when an external potential source, such as a user's hand 124 comes sufficiently close to sensing region 114 of lid 104 to establish a capacitance discernible by the system, that capacitance will influence the series capacitance (C1+Cprox) coupled to capacitance sensor 126. Thus, the magnitude of the capacitance may be used as a general measure of the proximity of the external potential source and that measurement can be output by capacitance sensor 126 as a digital signal. This output signal can be processed by circuitry of an associated electronic device 128 to provide a desired functionality in response to proximity of a user.

Those skilled in the art will recognize that there is some variability present in this measurement in many intended applications, such as where the proximity of a user's hand will be detected, as both the size and orientation of the hand may impact the capacitance measurement by capacitance sensor 126. Many techniques for evaluating the measured capacitance to determine proximity may be contemplated. One such technique is to establish a reference of an averaged and filtered capacitance signal, which may be a moving average, and to then identify a fast change from that moving average as a measure of proximity. The strength of the proximity signal will be a function of the proximity of the conducting body and the size of the conducting body; and will typically follow a power law for larger distances, but will move generally linearly at smaller distances.

As will be apparent to those skilled in the art, this form of proximity determination may be used in a variety of applications. For example, proximity of a user to the exterior of an enclosure, such as the depicted enclosure for a laptop computer, might be used to wake the computer from sleep; to initiate downloading of information such as e-mails or favorite web pages. Other similar functionality may be envisioned for other devices such as media players, cell phones, etc. It should also be noted that a proximity sensor generally as described in relation to FIGS. 1 and 2 might be used on an internal surface of the laptop. Alternatively, it might be utilized on external surface but where only a portion of the enclosure member or other outer surface component is formed of metal.

Due to lid 104 being at a floating electrical potential, over time it will accumulate electrical charge. As a result, it will be desirable to periodically recalibrate the sensors and to remove the capacitance accumulated on the plate. The charge may be removed by a temporary coupling of lid 104 to ground, and the floating average capacitance value may be reset to achieve such recalibration.

Figure 3:
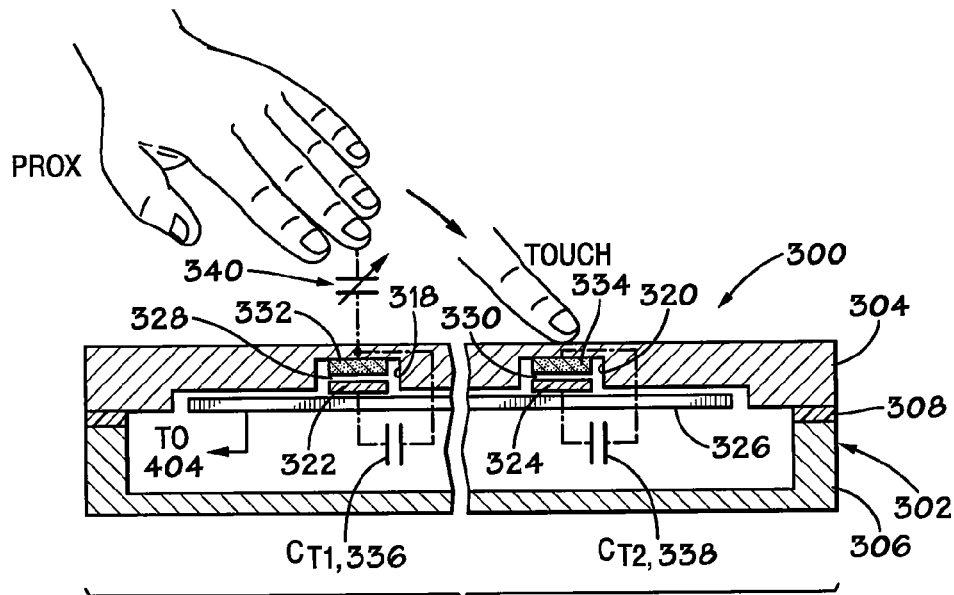
FIG. 3 depicts a simplified representation of the sensing components of a proximity and touch sensing system in accordance with the present invention.
Figure 4:
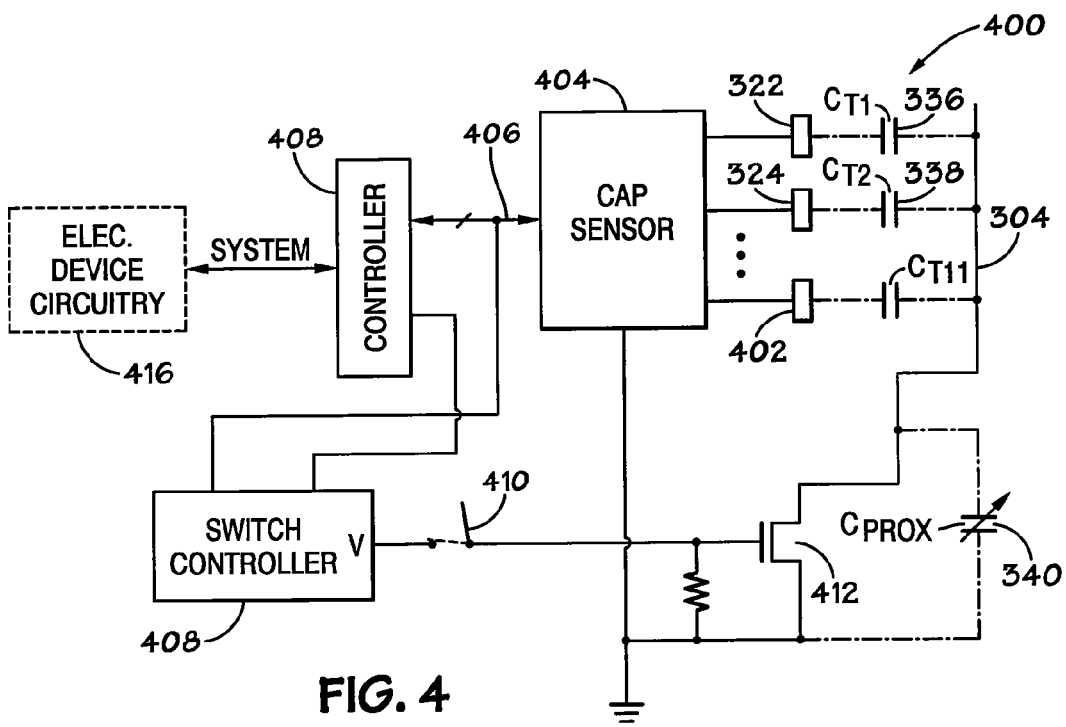
FIG. 4 depicts a schematic representation of proximity and touch sensing system utilizing the sensing components of FIG. 3.

Referring now to FIGS. 3 and 4, FIG. 3 depicts a simplified representation of the sensing components 300 of an example inventive proximity and touch sensing; and FIG. 4 depicts a schematic representation of a new proximity and touch sensing system using those sensing components. The present illustrative system operates in two distinct modes, a first mode for sensing proximity, and a second mode for sensing actual touch with a contact surface. Once proximity is sensed and evaluated to suggest that touch is likely, or imminent, one or more connections to the sensing components are switched to facilitate evaluating touch rather than proximity.

Figure 9:
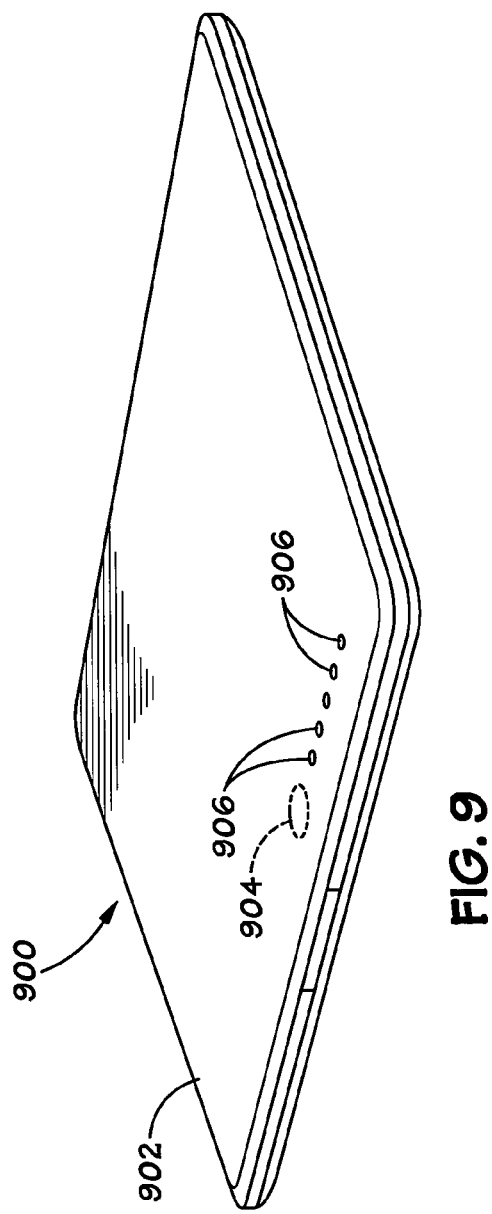
FIG. 9 Depicts an example laptop computer is a closed lid state, the computer lid having an example invisible button, and a plurality of invisible status indicators.

The determination that touch is likely or imminent may be established at a reference by which some further action or command (such as a transition from one state to another) is desired, based on the detected proximity. Touch will be sensed through a direct capacitive measurement resulting from deflection of the contact surface toward a reference electrode. A system for making this form of touch measurement is described in U.S. patent application Ser. No. 12/257,956, entitled Disappearing Button or Slider, and filed Oct. 24, 2008 on behalf of Leung and David Amm, and assigned to the assignee of the present application. This co-pending application is incorporated herein by reference for all purposes. As described in that application, in one implementation, a laptop, as depicted in FIG. 9 at 900, can have a surface, such as a lid 902, having an invisible "button" 904 that functions through capacitive sensing; and touch with such a "button" can provide a number of possible functions, such as displaying otherwise invisible status indicators 906 (such as for wi-fi strength or battery level); or signaling a component of the laptop or an associated external component to "wakeup" from a closed-lid "sleep" mode to a closed-lid "active" mode. Invisible button 904 and invisible status indicators 906 can employ invisible holes and backlighting to make them selectively visible to a user.

For example, sensing a touch, such as with a virtual "button" 904 when a laptop computer is in the closed-lid sleep mode, can wake up an external monitor (not shown), sync an iPod or iPhone (not shown) with the laptop computer 900, or install software to the laptop computer while lid is closed. In other implementations, touch with such an invisible button can shutdown the laptop computer from the closed-lid sleep or closed-lid active modes. Similarly, such invisible touch sensing controls could be used to control music or video played from the computer; such as through invisible controls for rewind, play and fast forward, as well as volume. Invisible holes can form patterns indicative of the functions of these buttons (e.g., rewind arrow, play arrow, fast forward arrow, volume increase plus, volume decrease minus, etc.); and the holes can be backlit, as described herein. In some examples, invisible touch controls can be contextual, having different functions dependent on an operating state of the device. As noted in the referenced application, the touch sensing controls could also be implemented as a track pad, with a large number of touch-sensing locations.

Figure 7A:
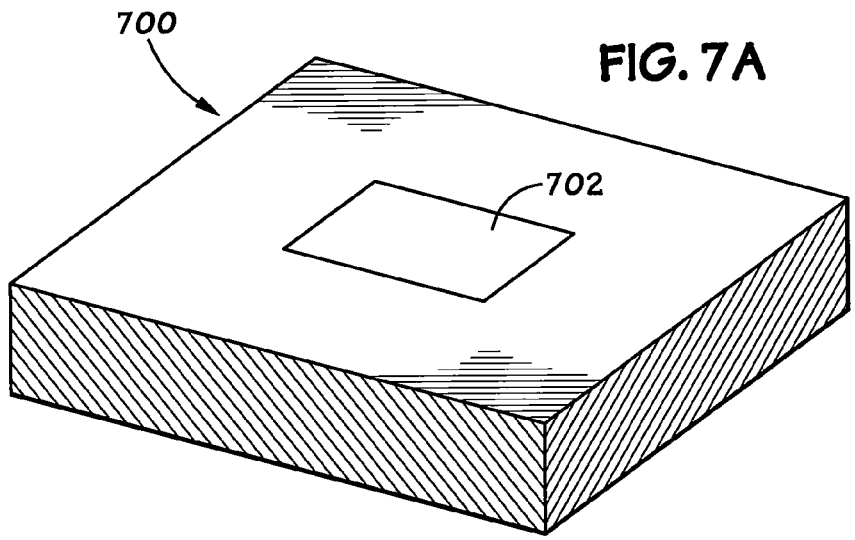
Figure 7B:
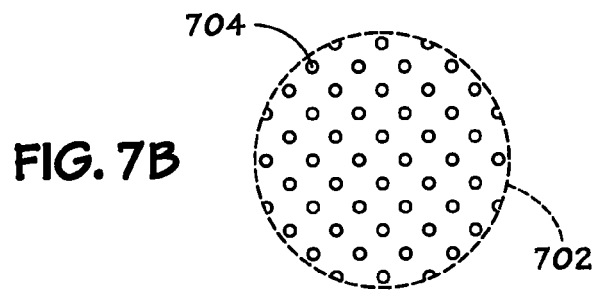
Figure 8:
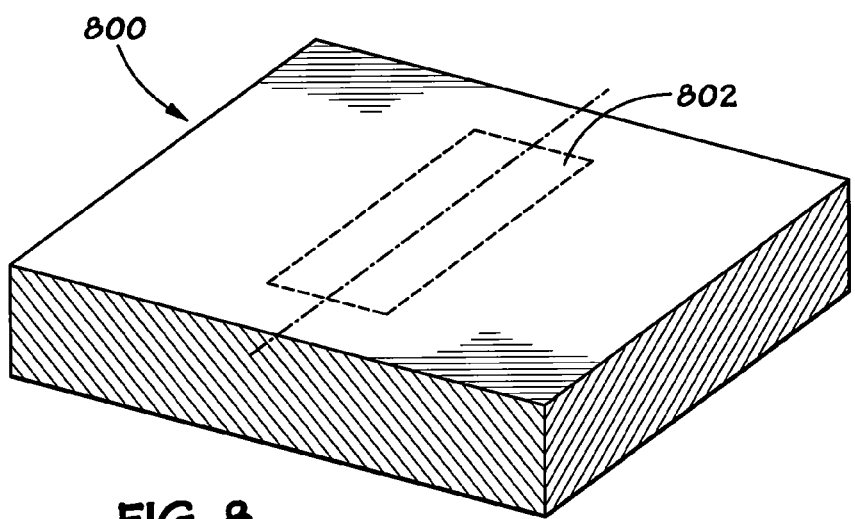
FIG. 8 depicts a portion of an electronic device with an invisible slider region on a surface of the device.

Also as described in the referenced application, and as depicted in FIGS. 7A-B and 8, the ability of a "button" or "slider" location 702, 802 to be invisible, but to selectively become visible can be achieved through tiny micro-perforations 704 formed in the surface that can be illuminated by backlighting such as through LEDs under the micro-perforations. The capacitive proximity sensing described herein can advantageously be used to trigger such invisible contact locations becoming visible once a user's hand (for example) nears the location, and to also then enable those locations to then sense touch from the user. The selective illumination of virtual buttons or sliders can be used both the provide guidance to a user as to where to provide an input, and as to what the function of the input will be. Additionally, where the result of the input is to provide information of the system status, or to update information data on the computer, indications of the status parameter, or of the presence of updated data, can be provided through use of selective illumination through the micro-perforations. An example of providing such indications in this manner is depicted in FIG. 9 herein.

For simplicity of explanation of the depicted subject matter, the proximity and touch sensing components are again described as implemented in an enclosure, indicated generally at 302, that is constructed similarly to enclosure 102 of FIG. 1, with the exception that enclosure 302 includes multiple sensing regions, two of which are depicted in FIG. 3 at 314 and 316, rather than the single sensing region 114 of FIG. 1. Thus, enclosure 302 will again be described as being formed of metal components including lid 304 and lower section 306, which are insulated from one another through an insulative gasket 308. The description relative to FIG. 1 of the need for other insulating components (not depicted) between the lid and the lower section is also applicable here. The multiple sensing regions may be of virtually any desired configuration, including for example, configurations ranging from individual virtual "buttons," to regions forming a virtual "slider," to a virtual keyboard, keypad or trackpad.

As with the system of FIG. 1, each sensing region 314, 316 is defined by a respective recess 326, 328 which will preferably leave a thickness of metal in the sensing region 318, 320 of approximately the previously described dimensions. Additionally, a respective reference electrode 322, 324 is disposed in each recess 326, 328, and in spaced relation to a proximate surface of sensing region 314, 316. In many examples in accordance with this basic description, it will be preferable for electrodes 322 324 to be supported independently of the proximate surface in each sensing region 314, 316. Additionally, for many such examples it will also be preferable to have either a number of conductive connections to individual respective sensing regions, or to have a number electrodes 322, 324 coupled to one another. Accordingly, in sensing components 300, each electrode 322, 324 is supported by a substrate, such as a printed circuit board 326. Printed circuit board 326 facilitates supporting each electrode 322, 324 in fixed, spaced relation to each sensing region. Again, as with the system of FIG. 1, the spaced relationship between each electrode 322, 324, and a respective surface of sensing regions 314, 316 may be established merely by an air gap 328, 330 and/or there may be a dielectric layer 332, 334 within the recess 326, 328.

Referring now primarily to FIG. 4, the figure schematically depicts proximity and touch sensing system 400 including the sensing components of FIG. 3. Elements depicted in FIG. 3 have been numbered similarly in FIG. 4. As depicted, each electrode 322, 324, 402 cooperatively forms a respective capacitor with top plate 304 ($C_{r1}$, $C_{r2}$), and each electrode 322, 324, 402 is coupled to a respective input of capacitance sensor 404 (which may of the same type, for example, as capacitance sensor 126 of FIGS. 1-2). Thus, again, each reference electrode is coupled to a high impedance at DC to ground. In this example, the output 406 of capacitance sensor 404 is coupled to a controller 408, which may be used to initiate various system functions in response to the signal from capacitance sensor 404. The same functionality may, of course, be provided by another controller in the associated electronic device 416. Output 406 is also coupled to a switch controller 409 which is responsive to the capacitance measurement signal from capacitance sensor 404, or to a control signal from controller 408, to selectively open or close a switch 410 to selectively apply a voltage of a desired polarity to the gate of a field effect transistor (FET) 412 placed to selectively couple lid 304 to ground. Although switch 410 is depicted as a mechanical switch, those skilled in the art will appreciate that it will, in most embodiments, be implemented through a solid-state switch such as a FET switch.

Figure 5:
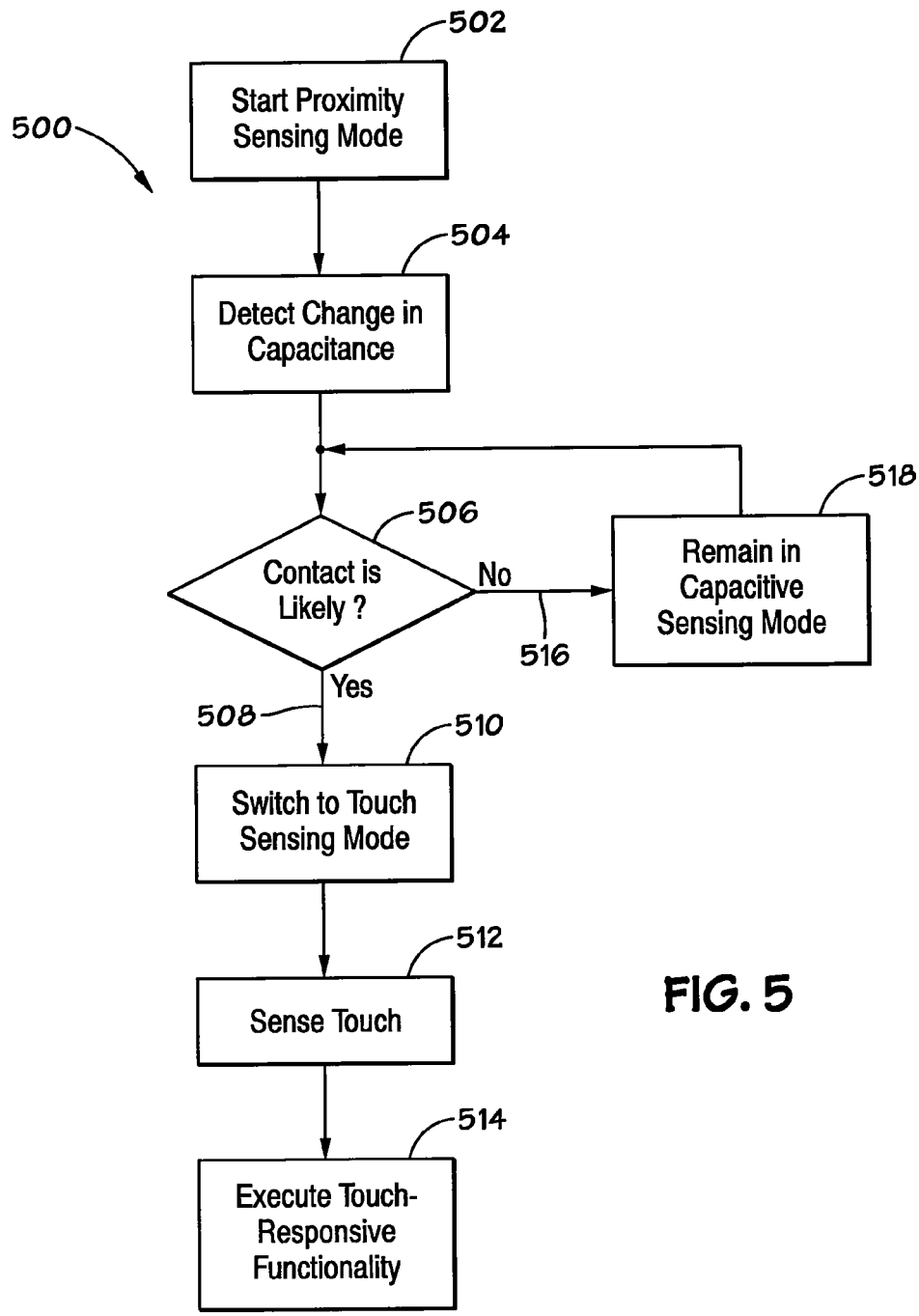
FIG. 5 depicts an example flow chart of a method of operation of the proximity and touch sensing system of FIGS. 3 and 4.

Referring now also to FIG. 5, that figure depicts an example flow chart 500 for one possible operational mode for the system of FIGS. 3 and 4. In operation of proximity and touch sensing system 400, the system will normally start in a proximity sensing mode 502. In this mode, the lid 304 is at a floating potential (as described in relation to FIG. 1), by virtue of FET switch 412 being open.

At some point, the system will detect a change in capacitance 504. As described relative to FIGS. 1 and 2, the presence of an external potential source proximate lid 304 will generate a capacitance (Ct+Cprox) at one or more sensing regions 314, 316 in lid 304, and that capacitance will be sensed by capacitance sensor 404. At some point, the sensed capacitance from capacitance sensor 404 will be evaluated 506 to determine is contact with lid 304 is likely. The sensed capacitance may be evaluated within controller 408 or within switch controller 409, preferably in reference to some parameter of the sensed capacitance, such as by comparison to either a reference capacitance (e.g., as a relative magnitude), or in response to a rate of change of the sensed change in capacitance; and the system will determine that the determined capacitance indicates that a contact with lid 304 is likely or imminent (as at 508). Until that determination of likely contact is made 508 (i.e., so long as the system determines that contact is not likely, as at 516), the system will remain in capacitive sensing mode 518.

When such determination is made, this example system will switch to touch sensing mode 510. To achieve this change, switch controller 409 will actuate to close switch 410, thereby providing a selected voltage to the gate of FET switch 412, and closing the switch 412 and electrically coupling lid 304 to ground. This coupling places the sensing mechanism in touch sensing mode.

A subsequent touch with the surface will generate one or more touch input signals 512. This is achieved by touch with any of sensing regions 314, 316 causing some degree of physical deflection of the sensing region, thereby reducing the distance between the capacitor plates formed by the respective electrode 322, 324 and the proximate surface of the sensing region 314, 316, thereby resulting in a change in the capacitance which may be detected by capacitance sensor 404, which will then output a signal representing a touch contact at that location.

With the multi-channel capacitance sensor as described, the presence or absence of touch at multiple locations (either simultaneously or sequentially) may be sensed (at 512), and the appropriate functionality implemented 514. As noted herein, that touch contact signal may be used by system controller 408 to implement the desired functionality in the associated electronic device 416. Once touch contacts are no longer sensed, a timer may be used to generate a timeout signal, after which the system will preferably be returned to proximity sensing mode through deactivation of switch 410, and thus also switch 412, returning lid 304 to its floating state.

As one example, a sensed contact at another location could result in a reset of the timer function. As an alternative, in touch sensing mode, Ctprox may be considered as the sum of sensory inputs to the multiple channels of capacitance sensor 404, and, for example, the sum of those signals can be evaluated relative to a minimum (Cmin) to determine an apparent absence of a user, and only then to start the timer.

Figure 6:
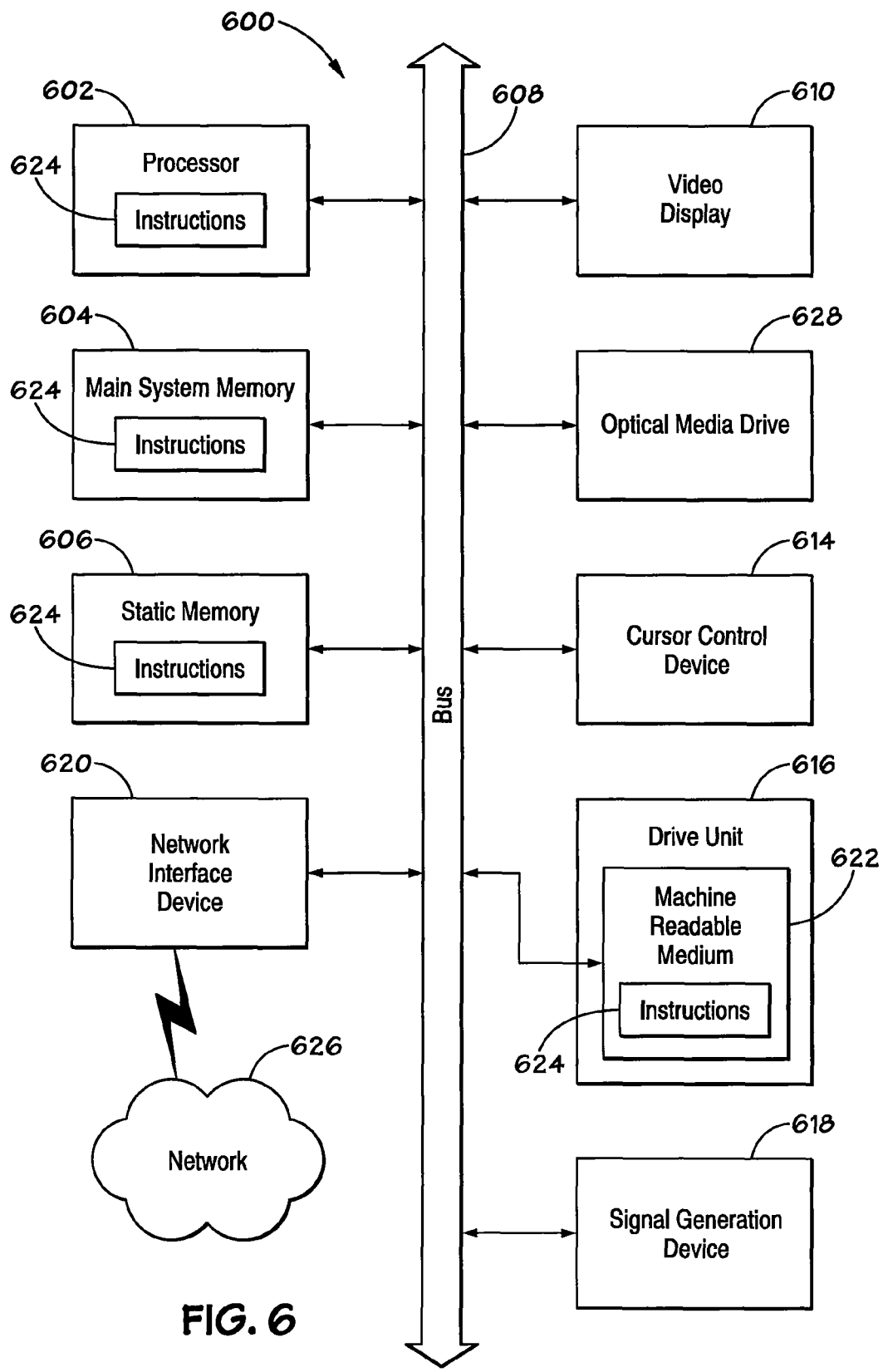
FIG. 6 depicts a block diagram representation of an example electronic device which may include or be used with any of the capacitive sensing systems or methods described herein.

FIG. 6 depicts a simplified block diagram of a machine in the example form of an electronic device, such as a computing device, within which a set of instructions, for causing the machine to perform any one or more of the methodologies discussed herein, may be executed. In alternative embodiments, the machine may be connected (e.g., networked) to other machines. In a networked deployment, the machine may operate in the capacity of a server or a client machine in client-server network environment, or as a peer machine in a peer-to-peer (or distributed) network environment. While only a single machine is illustrated, the term "machine" shall also be taken to include any collection of machines that individually or jointly execute a set (or multiple sets) of instructions to perform any one or more of the methodologies discussed herein.

Example computing device 600 includes at least one processor 602 (e.g., a central processing unit (CPU), a graphics processing unit (GPU) or both), main system memory 604 and static memory 606, which communicate with each other via bus 608. In some examples, the computing device will include multiple processors, wherein one is an auxiliary processor, that will preferably be a relatively low power device compared to the primary, or "system" processor(s), that may be powered on at almost all times other than complete system shutdown (such as in a "sleep" mode; for example, a mode in which the state of the system is preserved, but other operations by the system processor are disabled). Such an auxiliary processor will be used in such example systems to control the sensing circuitry herein even when the computing device is in a "closed lid" state, and/or in sleep mode. Additionally, such an auxiliary processor may be used in at least some of these example systems to implement various touch-responsive functionalities while still in the closed-lid state or a sleep state. For example, in addition to functions described elsewhere herein, such closed lid operations can include implementing wired or wireless communication systems to check for updated information data, such as for emails received, stock quotes, sports scores, etc.; checking on parameters of the system status (such as wi-fi signal strength or battery status); and displaying either the information or an indication that updated information is available, through the closed lid, such as through illuminating some portion of the micro-perforation regions, such as at or near the invisible buttons or sliders.

Computing device 200 may further include video display unit 610 (e.g., a plasma display, a Liquid Crystal Display (LCD), Organic Light Emitting Diode (OLED) display, Thin Film Transistor (TFT) display, or a cathode ray tube (CRT)). Computing device 600 also includes optical media drive 628, a user interface (UI) navigation, or cursor control, device 614 (e.g., a mouse), disk drive unit 616, signal generation device 618 (e.g., a speaker), optical media drive 628, and network interface device 620.

Disk drive unit 616 includes machine-readable medium 622 on which is stored one or more sets of instructions and data structures (e.g., software 624) embodying or utilized by any one or more of the methodologies or functions described herein. Software 624 may also reside, completely or at least partially, within main system memory 604 and/or within processor 602 during execution thereof by computing device 200, with main system memory 604 and processor 602 also constituting machine-readable, tangible media. Software 624 may further be transmitted or received over network 626 via network interface device 620 utilizing any one of a number of well-known transfer protocols (e.g., Hypertext Transfer Protocol (HTTP)).

While machine-readable medium 622 is shown in an example embodiment to be a single medium, the term "machine-readable medium" should be taken to include a single medium or multiple media (e.g., a centralized or distributed database, and/or associated caches) that store the one or more sets of instructions. The term "machine-readable medium" shall also be taken to include any medium that is capable of storing or encoding a set of instructions for execution by the machine and that cause the machine to perform any one or more of the methodologies of the present application, or that is capable of storing, encoding or carrying data structures utilized by or associated with such a set of instructions. The term "machine-readable storage medium" shall accordingly be taken to include all forms of solid-state memories, optical and magnetic media, and other structures facilitating reading of data stored or otherwise retained thereon.

Many additional alternative constructions may be envisioned to those skilled in the art having the benefit of the teachings of this disclosure; and many additional modifications and variations may be made in the techniques and structures described and illustrated herein. For example, the example capacitance sensor device identified operates by comparing a reference value to ground. Many other types of capacitance sensors may be used, with appropriate modifications apparent to those skilled in the art having the benefit of the present disclosure. For example, capacitance sensors might be used that measure capacitance directly between two sensing members. As one example of a modification to facilitate that type of capacitance sensor, the outer conductive member of each sensing location might be individually coupled to the outer plate through a respective FET switch. Accordingly the scope of the invention should be expressly understood to be limited only by the scope of all claims are supported by the present specification, as well as all equivalents of such claims.

We claim:

1. A sensing device, comprising:
    a conductive sensing member having a sensing surface and an opposite surface, wherein the sensing surface comprises an outer surface of an electronic device housing, wherein the sensing member is at a floating potential;
    a conductive reference member in spaced relation to the opposite surface of the sensing member, wherein the conductive reference member forms a capacitor with the conductive sensing member; and
    a capacitance sensing device coupled to both the conductive reference member and to ground, wherein the capacitance sensing device is configured to determine a change in capacitance between the conductive reference member and ground resulting from proximity of a human.

2. The sensing device of claim 1, wherein the conductive sensing member comprises a metal sensing surface.

3. The sensing device of claim 1, wherein the conductive sensing member is electrically insulated from other portions of the sensing device, to allow the conductive sensing member to be at the floating potential relative to the other portions of the sensing device.

4. The sensing device of claim 3, further comprising a switch assembly coupled to the sensing member and configured to switch the sensing member from a floating potential to a reference voltage potential.

5. The sensing device of claim 1, wherein the capacitive sensing device is configured to determine conditions indicative of likely contact between the human and the sensing surface of the sensing member.

6. The sensing device of claim 1, wherein the sensing device is an integral part of a portable electronic device.

7. The sensing device of claim 1, wherein the sensing device is an input device to a portable electronic device.

8. A method of determining the proximity of a user to an electronic device having a metal surface component, comprising:
    measuring a total capacitance between a reference electrode and a ground, wherein the total capacitance comprises a first capacitance between the metal surface component and the reference electrode and a second capacitance between the metal surface component and a reference, wherein the second capacitance is responsive to proximity of an external source of electric potential, and wherein the metal surface component comprises an outer surface of an electronic device housing.

9. The method of claim 8, further comprising:
    determining parameters of the total capacitance indicating that contact between the external source of electric potential and the metal surface component is likely.

10. The method of claim 8, wherein the electronic device is a portable electronic device, selected from the group consisting essentially of: a laptop computer, a phone, and a computer input device.

11. The method of claim 8, wherein the metal surface component of the electronic device is at a floating voltage potential relative to other components of the electronic device.

12. A method of operating an electronic device, comprising the acts of:
    determining a first capacitance between a metal surface component and a reference electrode, the reference electrode tied to a sensing device and placed proximate the metal surface component, with the metal surface component at a floating potential;
    identifying a second capacitance between the floating potential metal surface component and a reference, the second capacitance responsive to the presence of an external source of electric potential;
    identifying the proximity of a user to the metal surface component in response to a parameter of a capacitance measurement comprising a change in the second capacitance;
    in response to an identified proximity of a user, coupling the metal surface component to a direct current voltage reference; and
    identifying a contact with the metal surface component causing deflection of a portion of the metal surface component by measuring a change in capacitance between the metal surface component and the reference electrode resulting from the deflection, wherein the metal surface component comprises a location that in a first state forms an invisible contact location and in a second state forms a visible contact location, and wherein the method further comprises transitioning the location from the first state to the second state in response to the identified proximity of a user.

13. The method of operating an electronic device of claim 12, wherein the parameter of a capacitance measurement comprising a change in the second capacitance comprises the magnitude of the capacitance measurement.

14. The method of operating an electronic device of claim 12, wherein the parameter of a capacitance measurement comprising a change in the second capacitance comprises the rate of change of the capacitance measurement.

15. The method of operating an electronic device of claim 12, further comprising the act of receiving the identified contact with the metal surface as a touch input, and initiating a control function of the electronic device in response to the touch input.

16. The method of operating an electronic device of claim 15, wherein the touch input is a multi-touch input.

17. The method of operating an electronic device of claim 12, wherein the invisible contact location is not configured to sense touch input when the location is in the first state, and wherein the method further comprises transitioning the location to receive a touch input in response to the identified proximity of a user.

18. An electronic assembly, comprising:
   a capacitance sensing assembly that is operable in two states, a first state in which the assembly detects proximity of a source of electric potential and a second state in which the assembly detects contact with a source of electric potential, the sensing assembly comprising,
   a metal sensing member having a sensing surface and an opposite surface, and
   a first capacitive reference member in spaced relation to the opposite surface of the metal sensing member, and forming a capacitor with the metal sensing member,
   a switching assembly to selectively connect the metal sensing member between a first state in which the metal sensing member is at a floating potential and a second state in which the metal sensing member is coupled to a reference voltage, and
   a capacitance sensing device coupled to both the first capacitive reference member and the reference voltage, the capacitance sensing assembly configured to,
      determine a first parameter of change in capacitance between the conductive reference member and ground resulting from proximity of a source of electric potential relative to the metal sensing member when the metal sensing member is in the first floating state,
      generate a sensed proximity signal in response to the determined first parameter; and
      determine a second parameter of change in capacitance between the conductive reference member and the metal sensing resulting from contact of a source of electric potential with the metal sensing member causing deflection of the metal sensing member when the metal sensing member is in the second state, and
      generate a touch input signal in response to be determined second parameter.

19. The electronic assembly of claim 18, wherein the electronic assembly is configured to make a first change in an operating parameter of the assembly in response to a sensed proximity signal, and is further configured to make a second change in an operating parameter of the assembly in response to a touch signal.

20. The electronic assembly of claim 18, wherein the first determined parameter of change in capacitance comprises a magnitude of the change in capacitance.

21. The electronic assembly of claim 18, wherein the first determined parameter of change in capacitance comprises a rate of change of the change in capacitance.

22. The electronic assembly of claim 19, wherein the metal sensing member further comprises a contact location that is invisible in a first state and visible in a second state, and wherein the first change in an operating parameter of the assembly in response to a sensed proximity signal comprises changing the contact location appearance from the first invisible state to the second visible state.

23. A laptop computer moveable between a closed lid state and an open lid state, comprising:
   at least one processor;
   a capacitance sensing mechanism proximate a selected region of an external surface of the computer when the computer is in the closed lid state; and
   machine readable storage media containing instructions comprising,
      instructions to enable the capacitance sensor to detect a change in capacitance proximate the selected region of the external surface of the computer, when the computer is in the closed lid state,
      instructions to receive the detected capacitance as a touch input; and
      instructions to execute a touch responsive functionality in response to the sensed touch input.

24. The laptop computer of claim 23, wherein the instructions to detect a change in capacitance proximate the selected region of the external surface of the computer when the computer is in the closed lid state, comprise:
   instructions to configure the capacitance sensor in a proximity sensing mode;
   instructions to detect the proximity of a user to the selected region;
   instructions to determine that a touch input from the user is likely; and
   instructions to configure the capacitance sensor in a touch sensing mode in response to the determination that a touch input is likely.

25. The laptop computer of claim 23, wherein the touch responsive functionality comprises determining a system status parameter of the laptop computer.

26. The laptop computer of claim 23, wherein the touch responsive functionality comprises checking for updated data information.

27. The laptop computer of claim 23, wherein the one or more processors comprises a system processor and an auxiliary processor;
   wherein the auxiliary processor is a relatively low power processor; and
   wherein at least a portion of the identified instructions are executed by the auxiliary processor.

28. The laptop computer of claim 27, wherein the laptop computer is configured to maintain the auxiliary processor in an operable state when the computer is in a sleep mode.

* * * * *